United States Patent [19]
Lin et al.

[11] Patent Number: 5,891,783
[45] Date of Patent: Apr. 6, 1999

[54] METHOD OF REDUCING FRINGE CAPACITANCE

[75] Inventors: Chih-Hung Lin, Yilan; Jih-Wen Chou, Hsichu, both of Taiwan

[73] Assignee: United Semiconductor Corp., Taiwan

[21] Appl. No.: 927,323

[22] Filed: Sep. 11, 1997

[30] Foreign Application Priority Data

Jul. 24, 1997 [TW] Taiwan ................................ 86110521

[51] Int. Cl.⁶ .................................................. H01L 21/336
[52] U.S. Cl. .......................... 438/302; 438/307; 438/525; 438/585
[58] Field of Search ..................... 438/585, 305, 438/303, 307, 302, 525

[56] References Cited

U.S. PATENT DOCUMENTS

| | | |
|---|---|---|
| 4,144,101 | 3/1979 | Rideout . |
| 4,795,718 | 1/1989 | Beitman et al. ...................... 438/305 |
| 4,978,629 | 12/1990 | Komori et al. . |
| 5,196,357 | 3/1993 | Boardman et al. . |
| 5,272,100 | 12/1993 | Satoh et al. . |
| 5,448,094 | 9/1995 | Hsu ........................................ 257/330 |
| 5,698,461 | 12/1997 | Liu . |
| 5,736,446 | 4/1998 | Wu ........................................ 438/305 |

Primary Examiner—Richard A. Booth
Attorney, Agent, or Firm—Rabin & Champagne, P.C.

[57] ABSTRACT

A method of reducing the fringe capacitance between a gate and a substrate in a semiconductor device. A silicon nitride is formed over a substrate with a buffer oxide layer thereon and patterned to form an opening. The buffer oxide layer within the opening is removed and another oxide layer is formed at the same place as a gate oxide layer. A poly-gate is formed at the opening with a wider width than the opening. Thus, a part of the poly-gate at both ends covers a part of the silicon nitride layer. The silicon nitride layer is then removed and leaves the poly-gate as a T-shape with two ends suspended over the substrate. With a large angle, a light dopant is implanted into the substrate under the suspended part of the poly-gate to form a lightly doped region. With another smaller angle, a heavy dopant is implanted into the substrate beside the poly-gate. Therefore, a source/drain is formed. A undoped silicate glass layer and a borophosphosilicate layer are formed in sequence, and an air gap is formed between the suspended part of the poly-gate and the substrate.

14 Claims, 3 Drawing Sheets

METHOD OF REDUCING FRINGE CAPACITANCE

BACKGROUND OF THE INVENTION

1. Field of the Invention

The invention relates to methods of fabricating an integrated circuit, and more particularly to a method of reducing the fringe capacitance between a gate and a substrate.

2. Description of the Related Art

The dimension of semiconductor integrated circuits is being made smaller and smaller. During fabrication, every parameter is required to be accurate and precise since even a very tiny deviation may cause a fatal failure.

In FIG. 1, one conventional method of making a semiconductor device is presented. A semiconductor device including a substrate 100, a source 102 /drain 104, a poly-gate 106, a gate oxide 108 between the gate 106 and the substrate 100, and a pair of spacers 110 on the side wall of the gate 106 are shown in the figure. In addition, due to the hot electrons caused by a short channel, a pair of lightly doped regions are form between the source 102 and drain 104 under the gate 106.

If the thickness of the gate 106 is noted as $H_{int}$, the thickness of the gate oxide 108 is $t_{ox}$, there exists a gate fringe capacitance near the edge of the gate. The fringe capacitance C can be written as:

$$C = \epsilon \frac{2\pi}{\ln\left[1 + \frac{2t_{ox}}{H_{int}}\left(1 + \sqrt{1 + \frac{H_{int}}{t_{ox}}}\right)\right]} \quad (1)$$

Thus, provided that all geometric parameters, such as $H_{int}$ and $t_{ox}$, are kept in the same condition, the fringe capacitance C is proportional to the dielectric constant $\epsilon$ of the medium. In this case, the medium are the spacers 110. In conventional semiconductor devices, the material of the spacers is normally silicon oxide or silicon nitride. The dielectric constants of these two materials are about 3.9 and 7.5, respectively. It is known that the delay time $\tau$ is equal to the product of resistance R and the capacitance C. That is, $\tau = RC$. Therefore, the very high dielectric constant of silicon oxide or silicon nitride causes a measurable fringe capacitance. Thus, a very long delay time which deteriorates the operation of device, or even the whole integrated circuit, occurs.

SUMMARY OF THE INVENTION

It is therefore an object of the invention to provide a method of making a semiconductor device with a negligible delay time. More specifically, the object of the invention is to provide a method to reduce the fringe capacitance in the fabrication of a semiconductor device.

To achieve these and other objects, and in accordance with the purpose of the invention, as embodied and broadly described herein, the invention is directed toward a method for reducing the fringe capacitance, comprising first providing a substrate doped with a first type of dopant, on which a buffer oxide layer is formed. A silicon nitride layer is formed. By using photolithography and etching processes, the silicon nitride layer is patterned to form an opening. The buffer oxide layer within the opening is removed and an anti-punch through step is performed. Simultaneously, a threshold voltage is adjusted. A polysilicon layer is formed on the substrate and patterned into a poly-gate at the place of the opening with a width wider than the opening. Thus, a portion at both ends of the poly-gate covers a part of the silicon nitride layer. The silicon nitride layer is etched away to leave the poly-gate with two ends suspended over the substrate. A second type of dopant is lightly implanted into the substrate under the suspended part of the poly-gate at a first angle. The second type of dopant is heavily implanted into the substrate at a larger angle. Thus, a source/drain is formed beside the poly-gate. An undoped silicate glass layer is formed on the substrate, with an air gap existing between the suspended part of the poly-gate and the substrate. A borophosphosilicate glass is then formed over the silicate glass.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of the specification, illustrate an embodiment of the invention and together with the description, serve to explain the principles of the invention. In the drawings.

DESCRIPTION OF THE PREFERRED EMBODIMENT

According to the invention, with the formation of an air gap between a gate and a substrate, the fringe capacitance between the gate and the substrate is reduced due to the lower dielectric constant of air. Thus, the delay time is effectively shortened.

Figure 1:
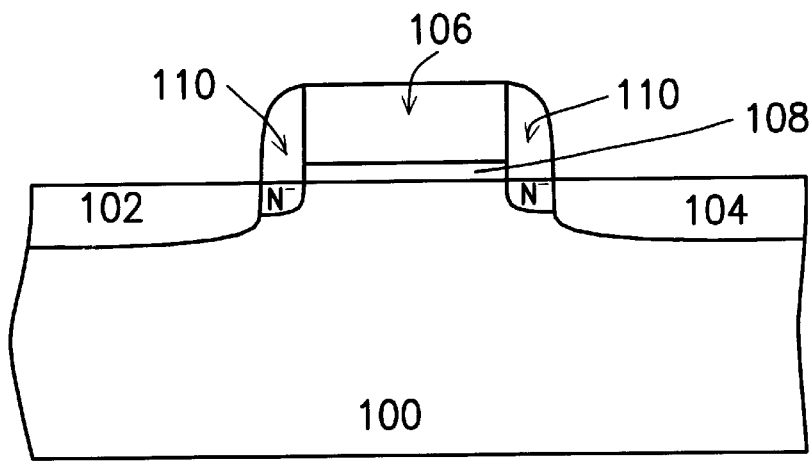
FIGS. 1 shows a conventional semiconductor device.
Figure 2A:
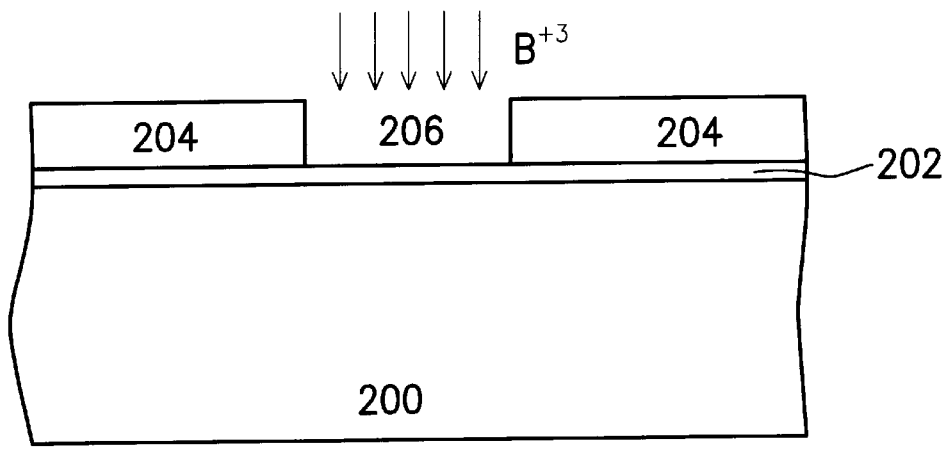
FIGS. 2A to 2G present one preferred embodiment according to the invention.

In FIG. 2A, on a doped substrate 200, for example, a P-type silicon substrate, a buffer oxide layer 202 and a silicon nitride layer 204 with a thickness of about 500 Å to 2000 Å, are formed in sequence. Using photolithography and etching, the silicon nitride layer 204 is patterned to form an opening 206. An anti-punch through step is performed by implanting a P-type dopant, for example, $B^{+3}$ ions, and simultaneously, the threshold voltage is adjusted.

Figure 2B:
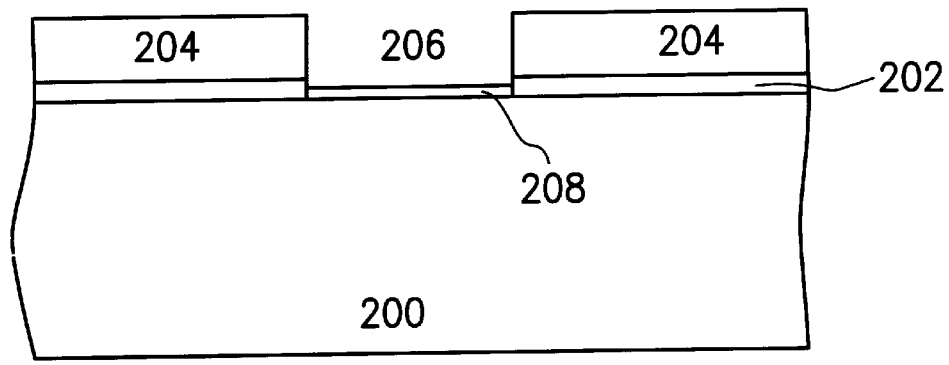

In FIG. 2B, the buffer oxide layer 202 within the opening 206 is removed. A gate oxide layer 208 is formed where the buffer layer 202 was removed. The thickness of the gate oxide layer 208 is about 50 Å to 100 Å.

Figure 2C:
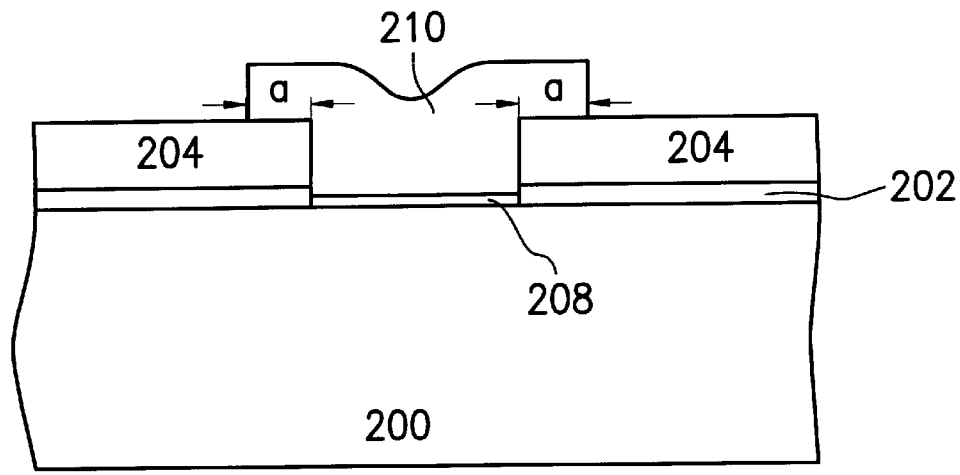

In FIG. 2C, a polysilicon layer with a thickness of about 500 Å to 3000 Å is formed over the substrate 200. The polysilicon layer is patterned to formed a poly-gate 210 at the opening 206. However, the width of the poly-gate 210 is about 0.05 μm to 0.1 μm wider than the width of the opening 206. Thus, the poly-gate 210 covers a portion of the silicon nitride layer 204 for a distance a of 0.05 μm to 0.1 μm at both ends.

Figure 2D:
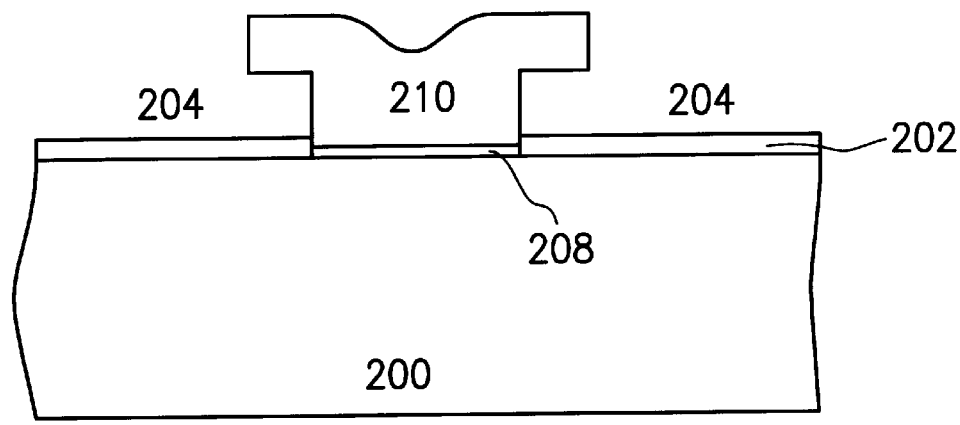

In FIG. 2D, the silicon nitride layer 204 is etched away. The poly-gate 210 is then in a T-shape with both ends suspended in the air over the substrate 200.

Figure 2E:
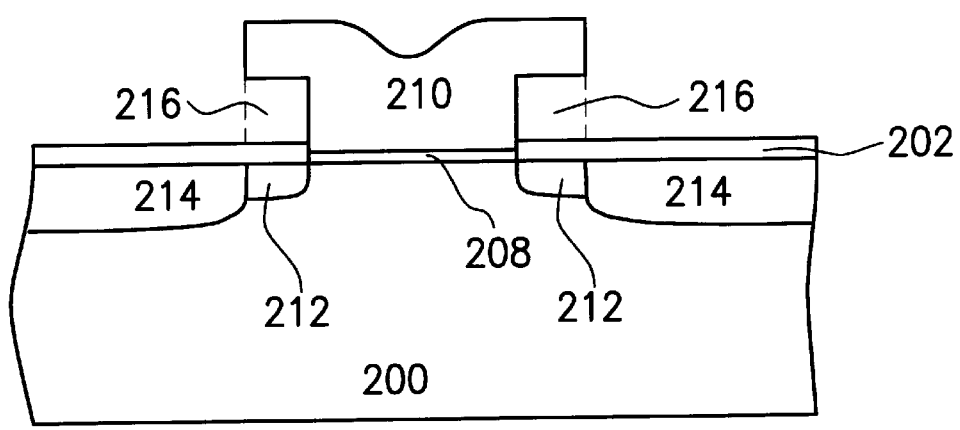

In FIG. 2E, at an angle between 15° to 45°, a light dopant, such as P31 ions or As ions, is implanted into the substrate 200 under the suspended part of the poly-gate 210. Therefore, a lightly doped region 212 is formed in the substrate 200 under the suspended part of the poly-gate 210. A heavy dopant, such as As ions, is implanted at an angle between 0° to 7° into the substrate 200 beside the poly-gate 210. Thus, a source/drain 214 is formed.

Figure 2F:
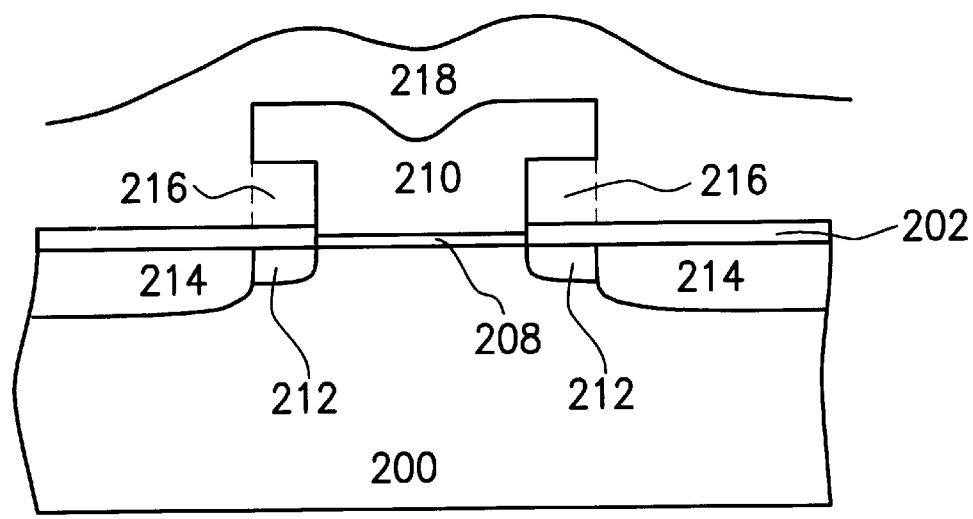
Figure 2G:
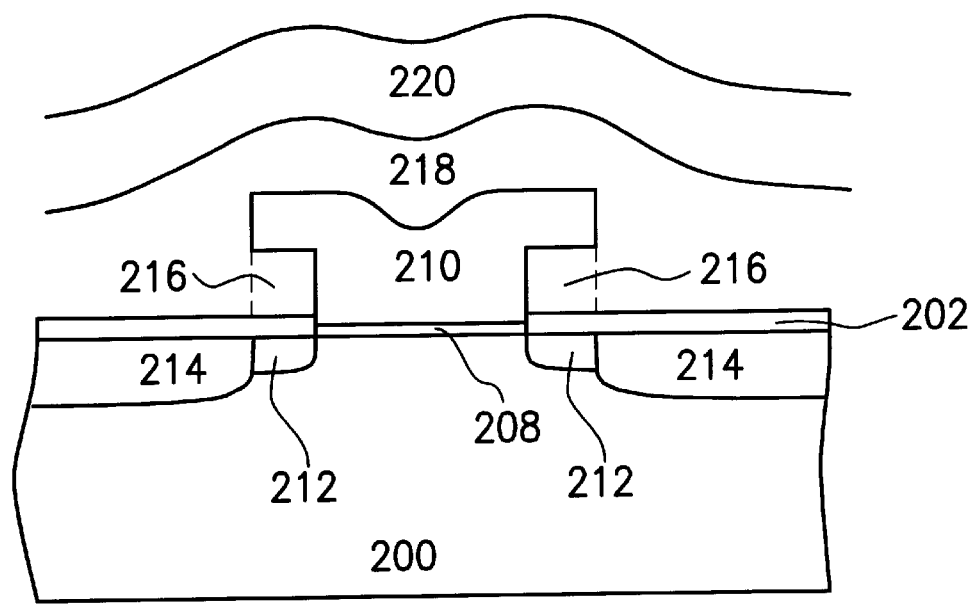

In FIG. 2F, an undoped silicate glass layer 218 is formed on the substrate 200. Between the suspended part of the poly-gate 210 and the substrate 200, there exists an air gap 216 at both ends of the poly-gate. The dielectric constant of air is about 1. Compared to the material of a conventional spacer, that is, silicon oxide or silicon nitride, the dielectric constant of air is much smaller, so that the fringe capacitance is reduced. Therefore, the RC delay time is shortened. The thickness of the air gap 216 is the same as the thickness of silicon nitride 204 which has been removed in the earlier operations, that is, about 500 Å to 2000 Å. The width of the air gap 216 is the width of the suspended part of the poly-gate 210, that is, 0.05 $\mu$m to 0.1 $\mu$m.

In FIG. 2F, a borophosphosilicate glass (BPSG) layer 220 is formed on the undoped silicon glass 218.

Other embodiments of the invention will be apparent to those skilled in the art from consideration of the specification and practice of the invention disclosed herein. It is intended that the specification and examples to be considered as exemplary only, with a true scope and spirit of the invention being indicated by the following claims.

What is claimed is:

1. A method of reducing the fringe capacitance, comprising:

providing a substrate doped with a first conductivity type of dopant, on which a buffer oxide layer is formed;

forming a silicon nitride layer over the substrate;

patterning the silicon nitride layer, using photolithography and etching processes, to form an opening and expose a portion of the buffer oxide layer;

removing the exposed portion of the buffer oxide layer within the opening;

lightly implanting the first conductivity type of dopant into the opening to simultaneously adjust a threshold voltage;

forming a polysilicon layer over the substrate;

patterning the polysilicon layer, using photolithography, to form a polysilicon gate covering the opening, the polysilicon gate having a width wider than the opening, so that two ends of the polysilicon gate cover a portion of the silicon nitride layer;

etching away the silicon nitride layer and leaving the two ends of the polysilicon gate suspended in air over the substrate;

lightly implanting, at a first angle, a second conductivity type of dopant into the substrate under the two suspended ends of the polysilicon gate;

heavily implanting, at a second angle, the second conductivity type of dopant into the substrate beside the polysilicon gate to form a source/drain;

forming an undoped silicate glass layer over the polysilicon gate, while maintaining an air gap between the two suspended ends of the polysilicon gate and the substrate; and forming a borophosphosilicate glass layer over the silicate glass layer.

2. The method according to claim 1, wherein the first conductivity type of dopant is a P-type dopant.

3. The method according to claim 2, wherein the second conductivity type of dopant is an N-type dopant.

4. The method according to claim 1, wherein the first conductivity type of dopant is a N-type dopant.

5. The method according to claim 4, wherein the second conductivity type of dopant is a P-type dopant.

6. The method according to claim 1, wherein said forming a silicon nitride layer includes forming the silicon nitride layer to a thickness of about 500 Å to about 2000 Å.

7. The method according to claim 6, wherein said forming an undoped silicate glass layer includes maintaining a thickness of the air gap in the range between about 500 Å and 2000 Å.

8. The method according to claim 7, further comprising forming a gate oxide layer having a thickness between about 50 Å to about 110 Å, within the opening and after said removing the exposed portion.

9. The method according to claim 1, wherein said forming a polysilicon layer includes forming the polysilicon layer to a thickness of about 500 Å to about 3000 Å.

10. The method according to claim 1, wherein said patterning the polysilicon layer includes forming the polysilicon gate to have a width that is about 0.05 $\mu$m to 0.1 $\mu$m wider than a width of the opening.

11. The method according to claim 10, wherein said forming an undoped silicate glass layer includes maintaining a width of the air gap to about 0.05 $\mu$m to 0.1 $\mu$m.

12. The method according to claim 1, wherein said lightly implanting includes implanting at a first angle of about 15° to 45°.

13. The method according to claim 1, wherein said heavily implanting includes implanting at second angle of about 0° to 7°.

14. A method of reducing the fringe capacitance between a gate and a substrate comprising:

forming a polysilicon gate covering an opening in a second dielectric layer formed over a first dielectric layer and the substrate, the polysilicon gate having a width wider than the opening, so that two ends of the polysilicon gate cover a portion of the second dielectric layer;

removing the second dielectric layer so that the two ends of the polysilicon gate are suspended in air over the substrate;

implanting a dopant into the substrate under the two suspended ends of the polysilicon gate;

implanting a dopant into the substrate beside the polysilicon gate to form a source/drain; and forming an undoped layer over the polysilicon gate and contacting the first dielectric on opposing sides of the gate, while maintaining an air gap between the two suspended ends of the polysilicon gate and the substrate.

* * * * *